(12) United States Patent
Miao et al.

(10) Patent No.: US 11,056,537 B2
(45) Date of Patent: Jul. 6, 2021

(54) SELF-ALIGNED GATE CONTACT INTEGRATION WITH METAL RESISTOR

(71) Applicant: INTERNATIONAL BUSINESS MACHINES CORPORATION, Armonk, NY (US)

(72) Inventors: Xin Miao, Slingerlands, NY (US); Richard A. Conti, Altamont, NY (US); Ruilong Xie, Niskayuna, NY (US); Kangguo Cheng, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 28 days.

(21) Appl. No.: 16/366,309

(22) Filed: Mar. 27, 2019

(65) Prior Publication Data
US 2020/0312909 A1 Oct. 1, 2020

(51) Int. Cl.
| | |
|---|---|
| *H01L 21/28* | (2006.01) |
| *H01L 27/24* | (2006.01) |
| *H01L 45/00* | (2006.01) |
| *H01L 21/285* | (2006.01) |
| *H01L 29/66* | (2006.01) |
| *H01L 29/45* | (2006.01) |
| *H01L 21/768* | (2006.01) |

(52) U.S. Cl.
CPC .... *H01L 27/2436* (2013.01); *H01L 21/28518* (2013.01); *H01L 27/2463* (2013.01); *H01L 29/45* (2013.01); *H01L 29/66515* (2013.01); *H01L 45/1608* (2013.01); *H01L 21/76897* (2013.01); *H01L 29/665* (2013.01); *H01L 29/66545* (2013.01); *H01L 29/66575* (2013.01)

(58) Field of Classification Search
CPC combination set(s) only.
See application file for complete search history.

(56) References Cited

U.S. PATENT DOCUMENTS

| | | | |
|---|---|---|---|
| 7,397,087 B2 | 7/2008 | Chinthakindi et al. | |
| 9,012,293 B2 | 4/2015 | Xiao et al. | |
| 9,312,185 B2 | 4/2016 | Tran et al. | |
| 9,478,468 B1 * | 10/2016 | Cheng | H01L 21/823828 |
| 9,478,625 B1 | 10/2016 | Zang et al. | |
| 9,570,571 B1 | 2/2017 | Basker et al. | |
| 9,698,212 B2 | 7/2017 | Basker et al. | |
| 9,876,010 B1 | 1/2018 | Zang et al. | |
| 10,573,723 B1 * | 2/2020 | Ando | H01L 29/78642 |
| 2005/0130383 A1 | 6/2005 | Divakaruni et al. | |
| 2014/0084381 A1 | 3/2014 | Yeh et al. | |

(Continued)

FOREIGN PATENT DOCUMENTS

WO 2018063259 A1 4/2018

*Primary Examiner* — Moin M Rahman
(74) *Attorney, Agent, or Firm* — Cantor Colburn LLP; Erik Johnson

(57) ABSTRACT

A middle-of-line (MOL) structure is provided and includes device and resistive memory (RM) regions. The device region includes trench silicide (TS) metallization, a first interlayer dielectric (ILD) portion and a first dielectric cap portion disposed over the TS metallization and the first ILD portion. The RM region includes a second dielectric cap portion, a second ILD portion and an RM resistor interposed between the second dielectric cap portion and the second ILD portion.

8 Claims, 6 Drawing Sheets

(56) References Cited

U.S. PATENT DOCUMENTS

| | | |
|---|---|---|
| 2014/0308785 A1 | 10/2014 | Yeh et al. |
| 2015/0235948 A1* | 8/2015 | Song .................... H01L 23/485 257/368 |
| 2018/0040557 A1 | 2/2018 | Basker et al. |
| 2018/0047668 A1 | 2/2018 | Adusumilli et al. |
| 2018/0097001 A1 | 4/2018 | Bi et al. |
| 2018/0114827 A1 | 4/2018 | Adusumilli et al. |

* cited by examiner

SELF-ALIGNED GATE CONTACT INTEGRATION WITH METAL RESISTOR

BACKGROUND

The present invention generally relates to fabrication methods and resulting structures for semiconductor devices. More specifically, the present invention relates to a self-aligned gate contact (SAGC) with a resistive metal (RM).

In semiconductor integrated circuits (IC), a metal resistor (RM resistor) can be formed as a planar metal resistor that is generally patterned during a middle-of-the-line (MOL) process, either above a trench silicide (TS) or above a diffusion contact (CA) layer.

SUMMARY

Embodiments of the present invention are directed to a middle-of-line (MOL) structure. A non-limiting example of the MOL structure includes device and resistive memory (RM) regions. The device region includes trench silicide (TS) metallization, a first interlayer dielectric (ILD) portion and a first dielectric cap portion disposed over the TS metallization and the first ILD portion. The RM region includes a second dielectric cap portion, a second ILD portion and an RM resistor interposed between the second dielectric cap portion and the second ILD portion.

Embodiments of the present invention are directed to a middle-of-line (MOL) structure. A non-limiting example of the MOL structure includes device and resistive memory (RM) regions and contact interlayer dielectric (ILD). The device region includes trench silicide (TS) metallization, a first interlayer dielectric (ILD) portion, a first dielectric cap portion disposed over the TS metallization and the first ILD portion and a source/drain (S/D) contact. The RM region includes a second dielectric cap portion, a second ILD portion and an RM resistor interposed between the second dielectric cap portion and the second ILD portion. The contact ILD is disposed over the first and second dielectric cap portions in the device and RM regions, respectively. The S/D contact has a height equal to a combined height of the first dielectric cap portion and the contact ILD.

Embodiments of the invention are directed to method of fabricating a middle-of-line (MOL) structure that includes device and resistive memory (RM) regions. A non-limiting example of the method includes forming lower source/drain (S/D) metallization in the device region, recessing ILD in the device and RM regions and disposing an RM resistor over the recessed ILD in the RM region. The non-limiting example of the method further includes recessing the lower S/D metallization in the device region, forming a dielectric cap over the recessed lower S/D metallization and the recessed ILD in the device region and over the RM resistor in the RM region and forming S/D contacts to the S/D metallization and the RM resistor in the device and RM region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
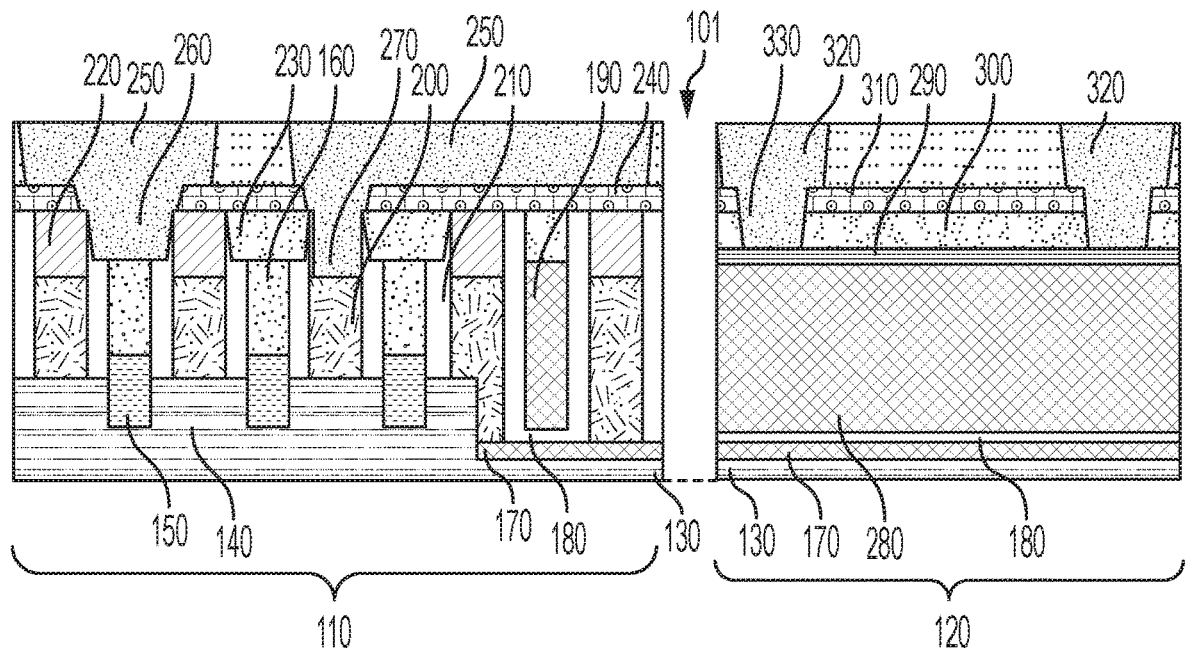
FIG. 1 is a side schematic view of a middle-of-line (MOL) structure including device and resistive memory (RM) regions in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, current resistive memory (RM) schemes for power-on-reset (POR) devices, in particular, require relatively tall source/drain (S/D) contact and interlayer dielectric (ILD) stacks. The resulting S/D contacts are tall and have relatively high resistance and capacitance characteristics which tend to degrade device performance. In some cases, the resulting S/D contacts can represent about 40% of total middle-of-line (MOL) resistance.

In greater detail, in a conventional MOL structure with a device region and an RM region, heights of the S/D contacts (hereinafter referred to as "CA contacts) in the device region are equal to a combined thickness of a relatively thick contact ILD layer and a dielectric cap that is provided over lower S/D metallization and heights of gate contacts (hereinafter referred to as "CB contacts") in the device region are equal to a combined thickness of a relatively thick contact ILD layer and a self-aligned gate contact (SAGC) cap. Meanwhile, heights of the CA contacts in the RM region are equal to an entire thickness of the contact ILD layer in the RM region (which is similar to the thickness of the contact ILD in the device region less a thickness of an RM layer).

While it is understood that reductions in the heights of the CA contacts can lead to corresponding reductions in resistance and capacitance, CA contact reductions in conventional MOL structures are limited by at least two factors. The first factor is that the heights the CA contacts in the device and RM regions are reserved for the insertion of the RM layer. The second factor is that the thickness of the dielectric cap in the device region is reserved for the SAGC cap.

Turning now to an overview of the aspects of the invention, one or more embodiments of the invention address the above-described shortcomings of the prior art by providing an MOL structure in which a trench silicide (TS) cap is disposed over TS metallization and ILD in a device region and in which an RM resistor layer is disposed between the TS cap and the ILD in an RM region.

The above-described aspects of the invention address the shortcomings of the prior art by providing for an RM resistor scheme to reduce the CA contact height as well as the CA contact resistance and capacitance and to thereby improve overall device performance. The RM resistor scheme is fully compatible with a SAGC contact structure.

Turning now to a more detailed description of aspects of the present invention, FIG. 1 depicts a middle-of-line (MOL) structure 101 including a device region 110, an RM region 120 and a substrate 130 that extends from the device region 110 to the RM region 120.

Within the device region 110, a fin structure 140 is disposed to extend upwardly from the substrate 130 with epitaxial bodies 150 disposed to extend upwardly from an interior of the fin structure 140 and to protrude above an uppermost surface of the fin structure 140. Lower S/D TS metallization elements 160 extend upwardly from the epitaxial bodies 150. Beyond an extent of the fin structure 140, shallow trench isolation (STI) material 170 and contact etch stop liner (CESL) material 180 are disposed on the substrate 130. An ILD portion body 190 extends upwardly from the CESL material 180. Uppermost surfaces of the lower S/D TS metallization elements 160 and the ILD portion body 190 are substantially coplanar. High-k metal gate (HKMG) elements 200 are interleaved between the ILD portion body 190 and the structures formed by the combinations of the epitaxial bodies 150 and the lower S/D TS metallization elements 160. Spacer elements 210 are interleaved between the HKMG elements 200, the ILD portion body 190 and the structures formed by the combinations of the epitaxial bodies 150 and the lower S/D TS metallization elements 160. An SAGC cap 220 can be formed to extend upwardly from one or more of the HKMG elements 200 and first portions of a TS dielectric cap 230 can be formed to extend upwardly from one or more of the lower S/D TS metallization elements 160. Uppermost surfaces of the SAGC cap 220 and the first portions of the TS dielectric cap 230 are substantially coplanar. A first contact ILD layer 240 is disposed over the spacer elements 210, the SAGC caps 220 and the first portions of the TS dielectric cap 230. Metallization layer elements 250 are disposed on the first contact ILD layer 240 and CA contacts 260 and CB contacts 270 extend downwardly from the metallization layer elements 250. The CA contacts 260 contact lower S/D TS metallization elements 160 that are not covered by the first portions of the TS dielectric cap 230. The CB contacts 270 contact HKMG elements 200 that are not covered by the SAGC caps 220.

Within the RM region 120, the STI material 170 and the CESL material 180 are disposed on the substrate 130. A block 280 of material of the ILD portion body 190 is disposed on the CESL material 180, an RM resistor layer 290 is disposed on the block 280, a second portion of the TS dielectric cap 300 is disposed on the RM resistor layer 290 and a second contact ILD layer 310 is disposed on the second portion of the TS dielectric cap 300. Metallization layer elements 320 are disposed on the second contact ILD layer 310 and CA contacts 330 extend downwardly from the metallization layer elements 320. The CA contacts 330 contact the RM resistor layer 290.

In accordance with embodiments of the present invention, a height of the first portions of the TS dielectric cap 230 is equal to a combined height of the second portion of the TS dielectric cap 300 and the RM resistor layer 290. In addition, the CA contacts 260 have heights that are equal to a combined height of the first portions of the TS dielectric cap 230 and the first contact ILD layer 240 and the CB contacts 270 have heights that are equal to a combined height of the SAGC caps 220 and the first contact ILD layer 240. Meanwhile, the CA contacts 330 have heights that are equal to a combined height of the second portion of the TS dielectric cap 300 and the second contact ILD layer 310. Also, the first contact ILD layer 240 can be thinner than at least the first portions of the TS dielectric cap 230.

A method of fabricating the MOL structure 101 of FIG. 1 in accordance with embodiments of the present invention will now be described with reference to FIGS. 2-10 and with additional reference back to FIG. 1.

Figure 2:
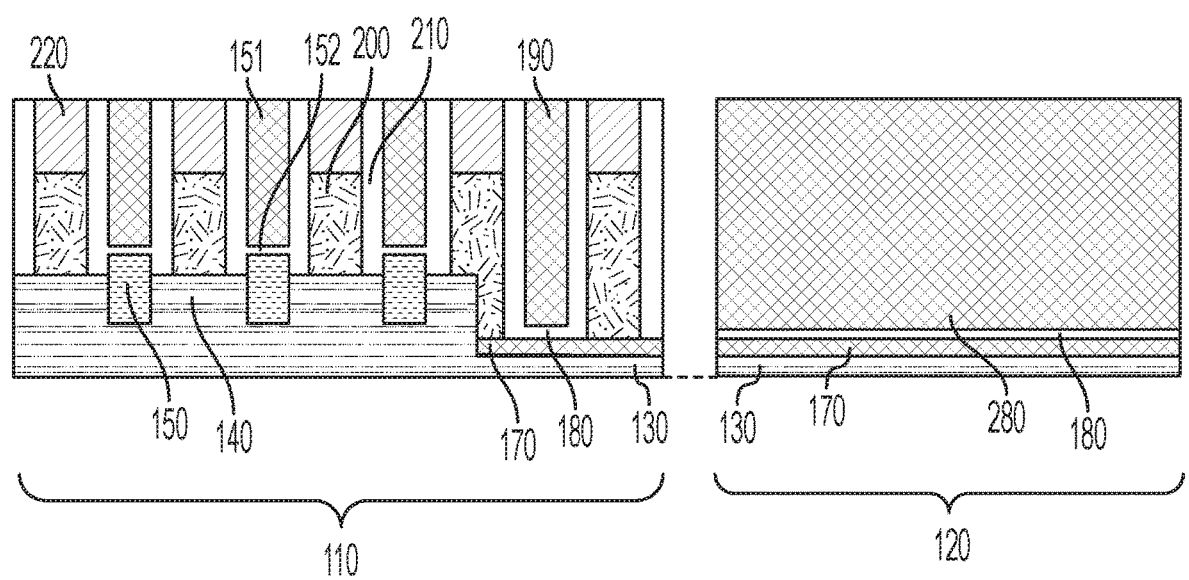
FIG. 2 is a side schematic view of a preliminary MOL structure following the formation of a self-aligned gate contact (SAC) cap and a chemical mechanical polishing (CMP) operation in accordance with embodiments of the present invention.

As shown in FIG. 2, within the device region 110, the fin structure 140 is disposed to extend upwardly from the substrate 130 with epitaxial bodies 150 disposed to extend upwardly from the interior of the fin structure 140 and to protrude above the uppermost surface of the fin structure 140. ILD bodies 151 extend upwardly from a layer of CESL 152 interposed between the epitaxial bodies 150 and the ILD bodies 151. Beyond the extent of the fin structure 140, the STI material 170 and the CESL material 180 are disposed on the substrate 130 and the ILD portion body 190 extends upwardly from the CESL material 180. The HKMG elements 200 are interleaved between the ILD portion body 190 and the structures formed by the combinations of the epitaxial bodies 150 and the CESL 152 and the ILD bodies 151 and the spacer elements 210 are interleaved between the HKMG elements 200, the ILD portion body 190 and the structures formed by the combinations of the epitaxial bodies 150, the CESL 152 and the ILD bodies 151. Multiple SAGC caps 220 are formed to extend upwardly from the HKMG elements 200. Following a chemical mechanical polishing (CMP) operation, uppermost surfaces of the multiple SAGC caps 220, the spacer elements 210, the ILD bodies 151 and the ILD portion body 190 are substantially coplanar with an uppermost surface of the block 280 within the RM region 120.

Figure 3:
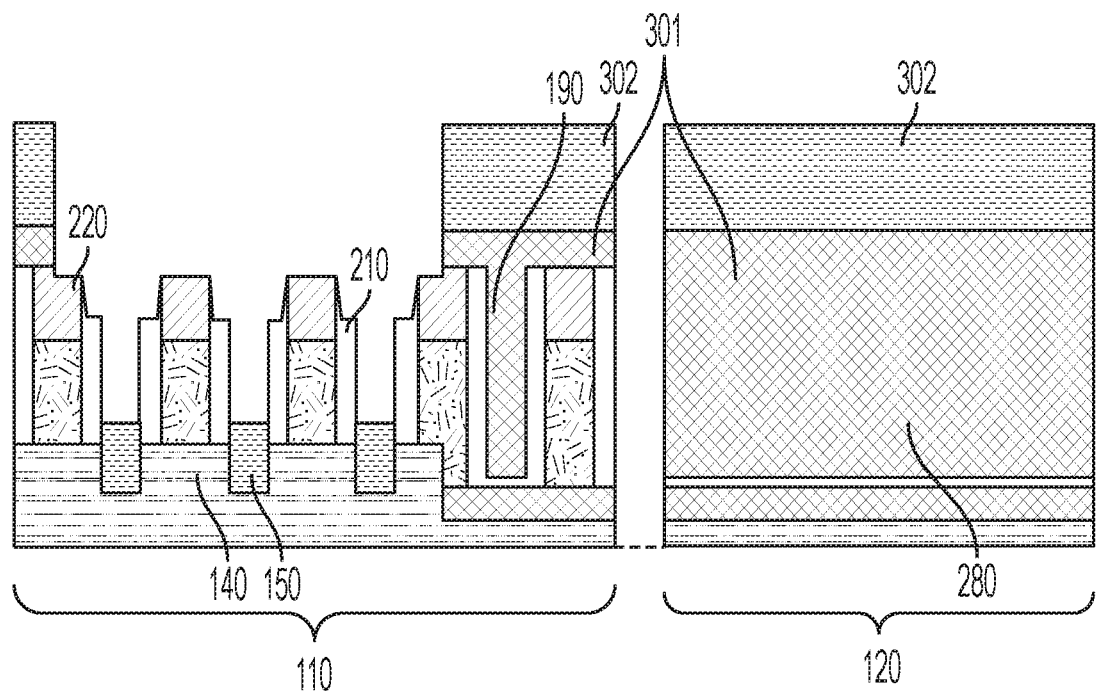
FIG. 3 is a side schematic view of the preliminary MOL structure of FIG. 2 following a trench silicide (TS) reactive ion etching (ME) operation in accordance with embodiments of the present invention.

As shown in FIG. 3, additional ILD material 301 is deposited onto the uppermost surfaces of the multiple SAGC caps 220, the spacer elements 210, the ILD bodies 151 (see FIG. 2) and the ILD portion body 190 within the device region 110 and onto the uppermost surface of the block 280 within the RM region 120. Subsequently, an organic planarization layer (OPL) 302 is deposited over the additional ILD material 301 and a TS reactive ion etch (ME) is conducted to remove upper portions of some of the spacer elements 210 above the fin structure 140 as well as the ILD bodies 151 and the CESL 152 to expose the corresponding epitaxial bodies 150.

Figure 4:
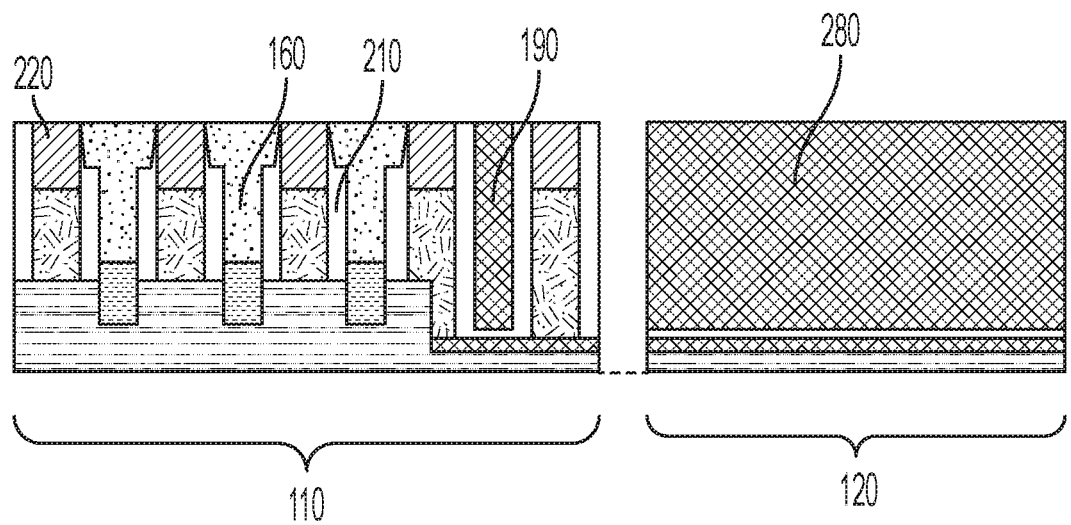
FIG. 4 is a side schematic view of the preliminary MOL structure of FIG. 3 following TS metallization and CMP operations in accordance with embodiments of the present invention.

As shown in FIG. 4, the lower S/D TS metallization elements 160 are formed in the regions previously occupied by the features removed by the TS RIE and another CMP operation is executed such that the uppermost surfaces of the lower S/D TS metallization elements 160, the multiple SAGC caps 220, the spacer elements 210 and the ILD portion body 190 are coplanar with the uppermost surface of the block 280.

Figure 5:
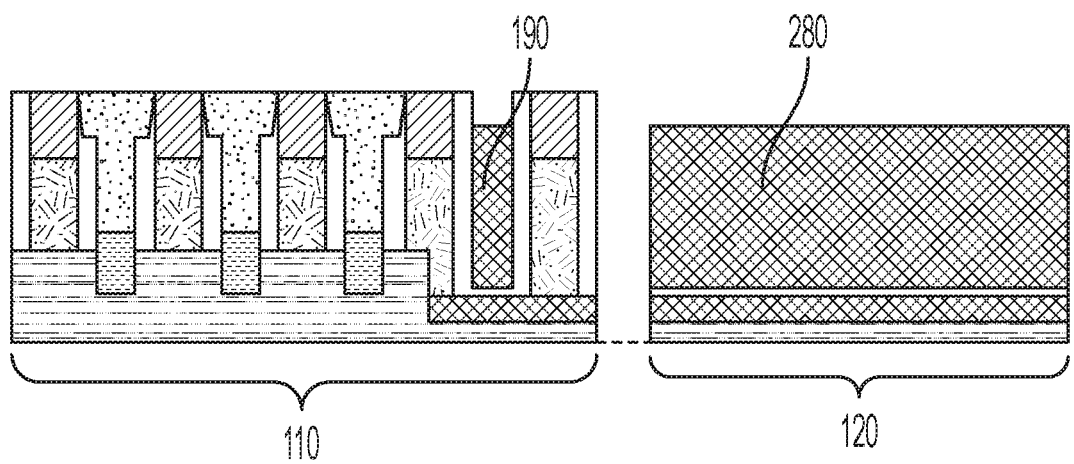
FIG. 5 is a side schematic view of the preliminary MOL structure of FIG. 4 following an oxide recess operation in accordance with embodiments of the present invention.

As shown in FIG. 5, an oxide recess operation is executed to recess the uppermost surfaces of the ILD portion body 190 and the block 280.

Figure 6:
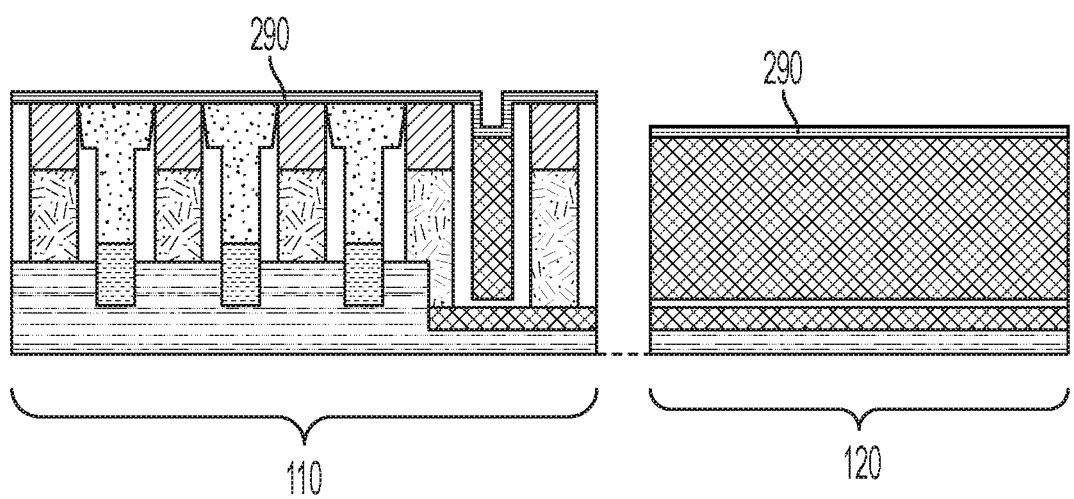
FIG. 6 is a side schematic view of the preliminary MOL structure of FIG. 5 following a resistive memory layer deposition operation in accordance with embodiments of the present invention.

As shown in FIG. 6, an RM resistor layer 290 is deposited in the device region 110 and the RM region 120.

Figure 7:
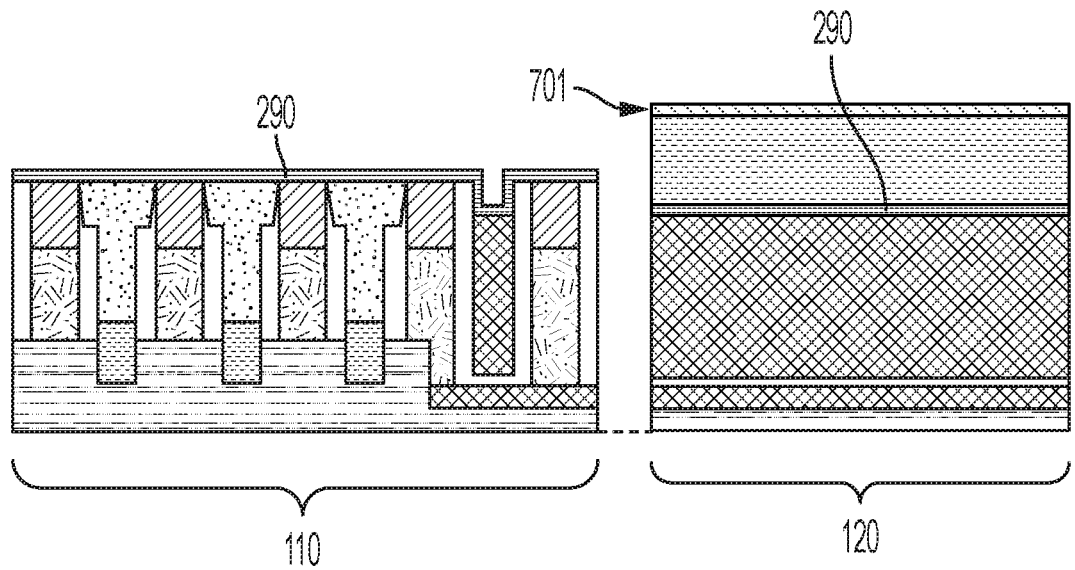
FIG. 7 is a side schematic view of the preliminary MOL structure of FIG. 6 following formation of a lithographic block to block the resistive memory layer in the RM region in accordance with embodiments of the present invention.

As shown in FIG. 7, a lithographic body 701 of OPL and an anti-reflective coating (ARC) is formed on the RM resistor layer 290 in the RM region 120 to block the RM resistor layer 290 therein.

Figure 8:
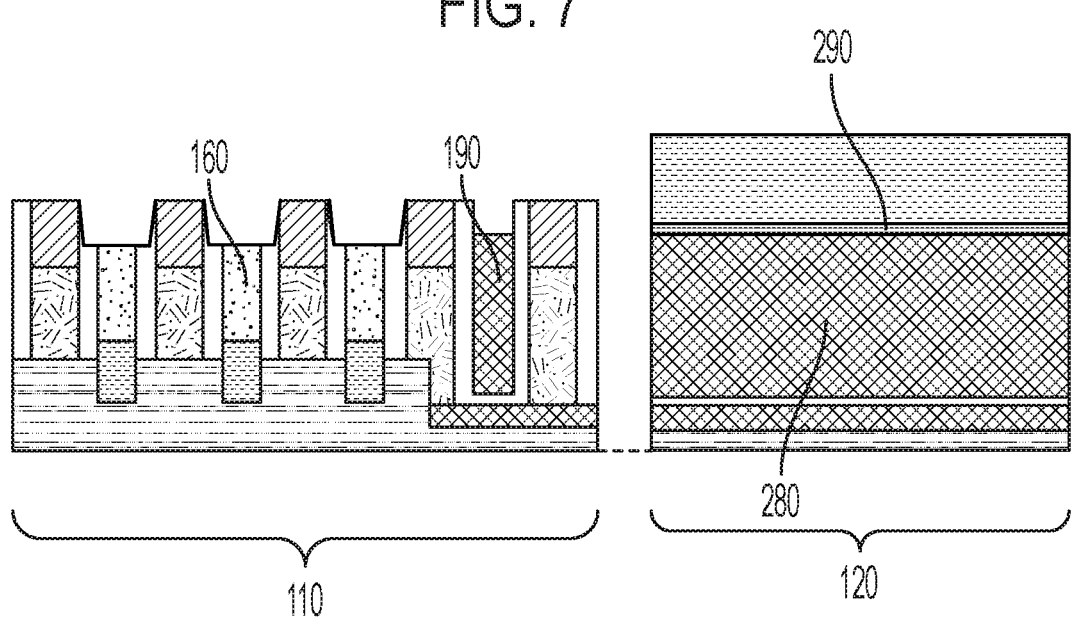
FIG. 8 is a side schematic view of the preliminary MOL structure of FIG. 7 following resistive memory layer removal and TS metal recess operations in the device region in accordance with embodiments of the present invention.

As shown in FIG. 8, lithography is executed to remove the RM resistor layer 290 in the device region 110 and is followed by a recession of the lower S/D metallization elements 160. As a result of the recession, uppermost surfaces of the lower S/D metallization elements 160 are substantially coplanar with the uppermost surfaces of the recessed ILD portion body 190 and the block 280.

Figure 9:
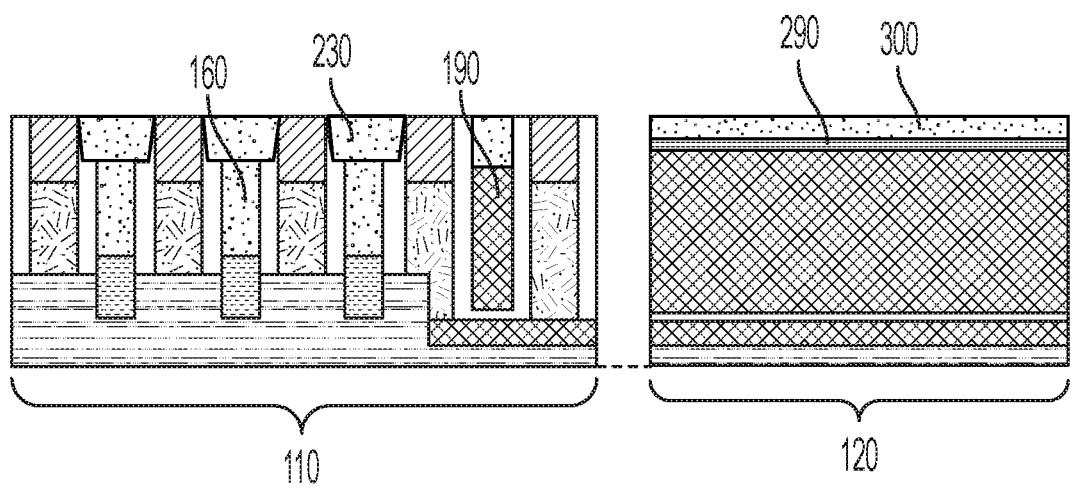
FIG. 9 is a side schematic view of the preliminary MOL structure of FIG. 8 following TS cap formation in the device and RM regions in accordance with embodiments of the present invention.

As shown in FIG. 9, the lithographic body 701 (see FIG. 7) is removed. The first portions of the TS dielectric cap 230 are formed in the device region 110 in the regions opened up by the oxide recess of the ILD portion body 190 and the recession of the lower S/D metallization elements 160. At a same time, the second portion of the TS dielectric cap 300 is formed over the RM resistor layer 290 in the RM region 120.

Figure 10:
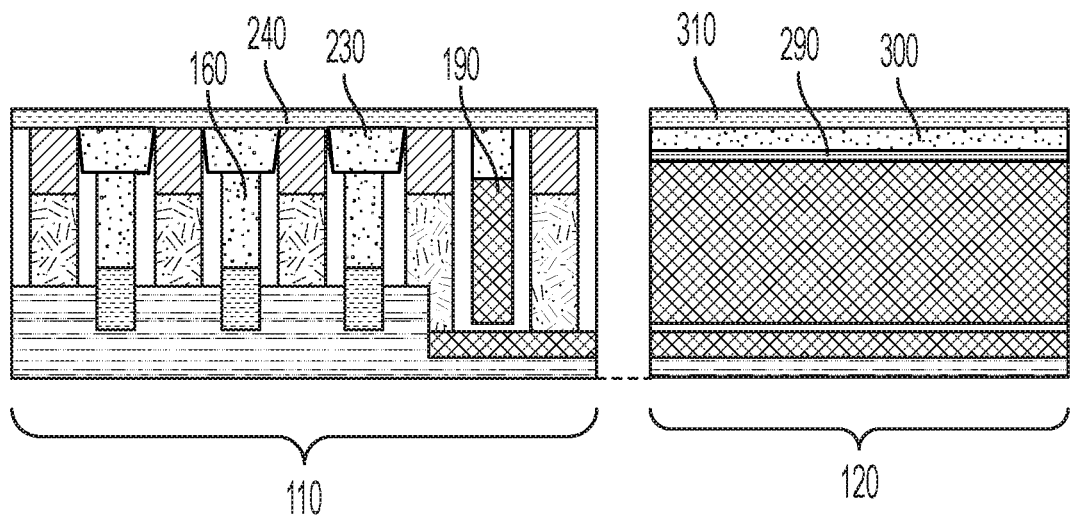
FIG. 10 is a side schematic view of the preliminary MOL structure of FIG. 9 following contact ILD formation in the device and RM regions in accordance with embodiments of the present invention.

As shown in FIG. 10, the first contact ILD layer 240 and the second contact ILD layer 310 are formed in the device region 110 and the RM region 120, respectively.

Subsequently, as shown in FIG. 1, the metallization layer elements 250 are disposed on the first contact ILD layer 240 and the CA contacts 260 and the CB contacts 270 are formed to extend downwardly from the metallization layer elements 250 within the device region 110. The CA contacts 260 contact lower S/D TS metallization elements 160 that are not covered by the first portions of the TS dielectric cap 230. The CB contacts 270 contact HKMG elements 200 that are not covered by the SAGC caps 220. At a same time, within the RM region 120, the metallization layer elements 320 are disposed on the second contact ILD layer 310 and the CA contacts 330 are formed to extend downwardly from the metallization layer elements 320. The CA contacts 330 contact the RM resistor layer 290.

Figure 11:
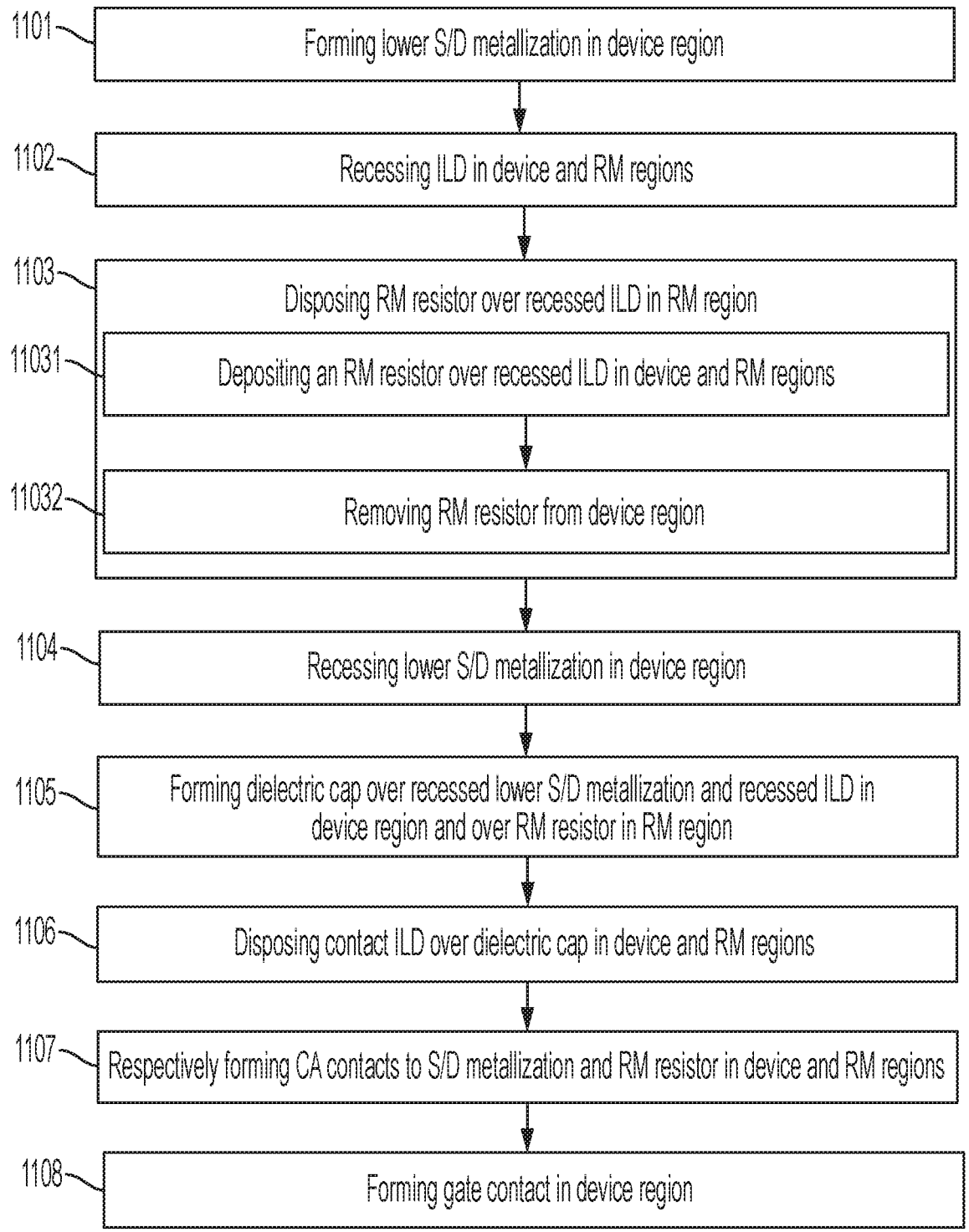
FIG. 11 is a flow diagram illustrating a method of fabricating an MOL structure that includes device and RM regions in accordance with embodiments.

With reference to FIG. 11, a method of fabricating an MOL structure that includes device and resistive memory (RM) regions. As shown in FIG. 11, the method includes forming lower S/D metallization in the device region 1101, recessing ILD in the device and RM regions 1102 and disposing an RM resistor over the recessed ILD in the RM region 1103. The disposing of the RM resistor over the recessed ILD in the RM region of operation 1103 can include depositing an RM resistor over the recessed ILD in the device and RM regions 11031 and removing the RM resistor from the device region 11032. The method can further include recessing the lower S/D metallization in the device region 1104, forming a dielectric cap over the recessed lower S/D metallization and the recessed ILD in the device region and over the RM resistor in the RM region 1105 and disposing contact ILD over the dielectric cap in the device and RM regions 1106. Subsequently, the method includes respectively forming CA contacts to the S/D metallization and the RM resistor in the device and RM regions 1107 and forming a gate contact in the device region 1108.

In accordance with embodiments of the present invention, the forming of the dielectric cap in the device and RM regions is executed such that a height of the dielectric cap in the device region is equal to a combined height of the dielectric cap and the RM resistor in the RM region. In addition, the forming of the CA contact in the device region of operation 1107 is executed such that the CA contact in the device region has a height equal to a combined height of the dielectric cap and the contact ILD and the forming of the CA contact in the RM region of operation 1107 is executed such that the CA contact in the RM region has a height equal to a combined height of the dielectric cap and the contact ILD. Also, the forming of the gate contact in the device region of operation 1108 is executed such that the gate contact has a height equal to a combined height of a self-aligned gate contact (SAGC) cap and the contact ILD. Further, the disposing of the contact ILD of operation 1106 is executed such that the contact ILD is thinner than at least the dielectric cap in the device region.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a middle-of-line (MOL) structure comprising a device region and a resistive memory (RM) region, the method comprising:
    forming lower source/drain (S/D) metallization interleaved with gate elements in the device region; recessing interlayer dielectric (ILD) in the device region and RM region; disposing an RM resistor over the recessed ILD in the RM region; recessing the lower S/D metallization in the device region; forming a dielectric cap over the recessed lower S/D metallization and the recessed ILD in the device region and over the RM resistor in the RM region; forming first S/D contacts to the S/D metallization in the device region; forming second S/D contacts to the gate elements in the device region; and forming an S/D contact to the RM resistor in the RM region.

2. The method according to claim 1, wherein the disposing of the RM resistor over the recessed ILD in the RM region comprises: depositing an RM resistor over the recessed ILD in the device and RM region; and removing the RM resistor from the device region.

3. The method according to claim 1, wherein the forming of the dielectric cap in the device and RM region is executed such that a height of the dielectric cap in the device region is equal to a combined height of the dielectric cap and the RM resistor in the RM region.

4. The method according to claim 1 further comprising disposing contact ILD over the dielectric cap in the device and RM region.

5. The method according to claim 4, wherein the forming of the first S/D contact in the device region is executed such that the first S/D contact in the device region has a height equal to a combined height of the dielectric cap and the contact ILD.

6. The method according to claim 5, wherein:
    the method further comprises forming a gate contact in the device region, and
    the forming of the gate contact in the device region is executed such that the gate contact has a height equal to a combined height of a self-aligned gate contact (SAGC) cap and the contact ILD.

7. The method according to claim 4, wherein the forming of the S/D contact in the RM region is executed such that the S/D contact in the RM region has a height equal to a combined height of the dielectric cap and the contact ILD.

8. The method according to claim 4, wherein the disposing of the contact ILD is executed such that the contact ILD is thinner than at least the dielectric cap in the device region.

* * * * *